United States Patent [19]

Uchida

[11] Patent Number: 4,794,571
[45] Date of Patent: Dec. 27, 1988

[54] DYNAMIC READ-WRITE RANDOM ACCESS MEMORY

[75] Inventor: Yukimasa Uchida, Yokohama, Japan
[73] Assignee: Kabushiki Kaisha Toshiba, Kawasaki, Japan
[21] Appl. No.: 143,204
[22] Filed: Jan. 11, 1988

Related U.S. Application Data

[63] Continuation of Ser. No. 704,210, Feb. 22, 1985, abandoned.

[30] Foreign Application Priority Data

Mar. 9, 1984 [JP] Japan .................. 59-45202

[51] Int. Cl.⁴ .......................... G11C 11/24
[52] U.S. Cl. .................. 365/205; 365/149; 365/203; 365/210; 365/226
[58] Field of Search .......... 365/149, 203, 205, 210, 365/226

[56] References Cited

U.S. PATENT DOCUMENTS

| | | | |
|---|---|---|---|
| 3,514,765 | 5/1970 | Christensen | 365/203 |
| 3,678,473 | 7/1972 | Wahlstrom | 365/149 |
| 3,774,176 | 11/1973 | Stein | 365/205 |
| 4,099,265 | 7/1978 | Abe | 365/190 |
| 4,158,241 | 6/1979 | Takemae et al. | 365/205 |
| 4,204,277 | 5/1980 | Kinoshita | 365/203 |
| 4,368,529 | 1/1983 | Furuyama et al. | 365/205 |

FOREIGN PATENT DOCUMENTS 2454988 1/1976 Fed. Rep. of Germany .
2006562 2/1979 United Kingdom .

OTHER PUBLICATIONS

"A 5V-Only 64K Dynamic RAM", Lionel S. White, Jr. et al., 1980 ISSCC Dig. Tech. Papers, pp. 230-231, Feb. 1980.
"A 256K RAM Fabricated with Molybdenum-Polysilicon Technology", T. Mano et al., 1980 ISSCC Dig. Tech. Papers, pp. 234-235, Feb. 1980.
Patent Abstracts of Japan, vol. 6, No. 75 (P-114) [953], 5-12-82; & JP A-57-12-483 (Nippon Denki K.K.) 1-2-2-82.
"Analog Capabilities on Metal Gate CMOS Arrays'-'-8080 Wescon Technical Papers; vol. 26, Sep. 1982, pp. 1-6.

Primary Examiner—James W. Moffitt
Attorney, Agent, or Firm—Oblon, Fisher, Spivak, McClelland & Maier

[57] ABSTRACT

A dynamic read-write random access memory (DRAM) including a memory cell, a word line and a bit line. The memory cell has a capacitor and a MOS transistor which has a gate connected to the word line, a drain terminal connected to the capacitor and a source terminal connected to the bit line. The DRAM further includes a supply circuit for applying to the bit line a voltage level having a value between the voltage level of the word line and the voltage level of the drain terminal of the MOS transistor when the memory cell is not selected, so as to prevent leakage current from flowing through the MOS transistor.

19 Claims, 7 Drawing Sheets

DYNAMIC READ-WRITE RANDOM ACCESS MEMORY

This application is a continuation of application Ser. No. 704,210, filed on Feb. 22, 1985, now abandoned.

BACKGROUND OF THE INVNTION

1. Field of the Invention

This invention relates to a dynamic read-write random access memory, and more particularly to a dynamic read-write random access memory fabricated of MOS transistors.

2. Description of the Prior Art

Various electrical circuits such as a processor and a memory have been integrated on a semiconductor chip due to recent prominent developments in semiconductor techniques.

A dynamic read-write random access memory, hereinafter abbreviated as a "DRAM", is a semiconductor memory of the type admitting of not only the reading but also the writing of data. It is adapted to a large capacity memory for storing data in the form of stored electric charge, because it employs a memory cell formed of a small number of transistors.

Figure 1:
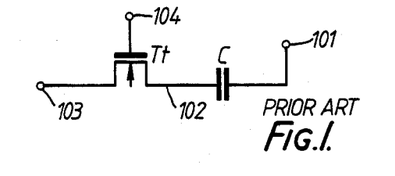
FIG. 1 is a circuit diagram of a conventional memory cell having a transistor and a capacitor.

FIG. 1 is one example circuit diagram of a memory cell that includes a transistor and a capacitor. This memory cell is most used in a DRAM because of its small number of transistors.

In fact, this memory cell includes a capacitor (C) for storing data and a MOS transistor ($T_t$) for transferring data.

Data is stored in the capacitor (C) connected between a voltage supply terminal (101) that supplies one voltage level (e.g., 5 v) and a drain terminal (102) of the transistor ($T_t$).

A writing operation of the memory cell is as follows:
(i) a source terminal (103) of the transistor ($T_t$) is supplied with one voltage level, for example, a high voltage level (i.e. "1", e.g., 5 v) correspnnding to the data to be written;
(ii) a gate terminal (104) of the transistor ($T_t$) is supplied with a high voltage level (e.g. 5 v) to the selected memory cell such that the voltage level of the drain terminal (102) becomes a "1" voltage level, corresponding to the voltage level on the source terminal (103); and
(iii) the voltage level of the gate terminal (104) changes from the high voltage level to a low voltage level, such that the transistor ($T_t$) becomes nonconductive.

On the other hand, a reading operation from the memory cell is made by detecting (i.e. sensing) a change of the voltage level of the source terminal (103) of the transistor ($T_t$) at a time when the gate terminal (104) of the transistor ($T_t$) is supplied the high voltage level to select the memory cell.

Although the above operation is explained by using one memory cell, an actual DRAM has many memory cells. Many source terminals of the memory cells are connected to a bit line, and as a result, a large stray capacitor occurs between the bit line and the semiconductor substrate. The capacitance of the stray capacitor is usually much larger than the capacitor (C). So, the change of the voltage level of the source terminal (103) of the transistor ($T_t$) is very small when the memory cell is selected. For that reason, the prior art DRAM usually has a sense amplfiier and a precharge circuit.

Figure 2:
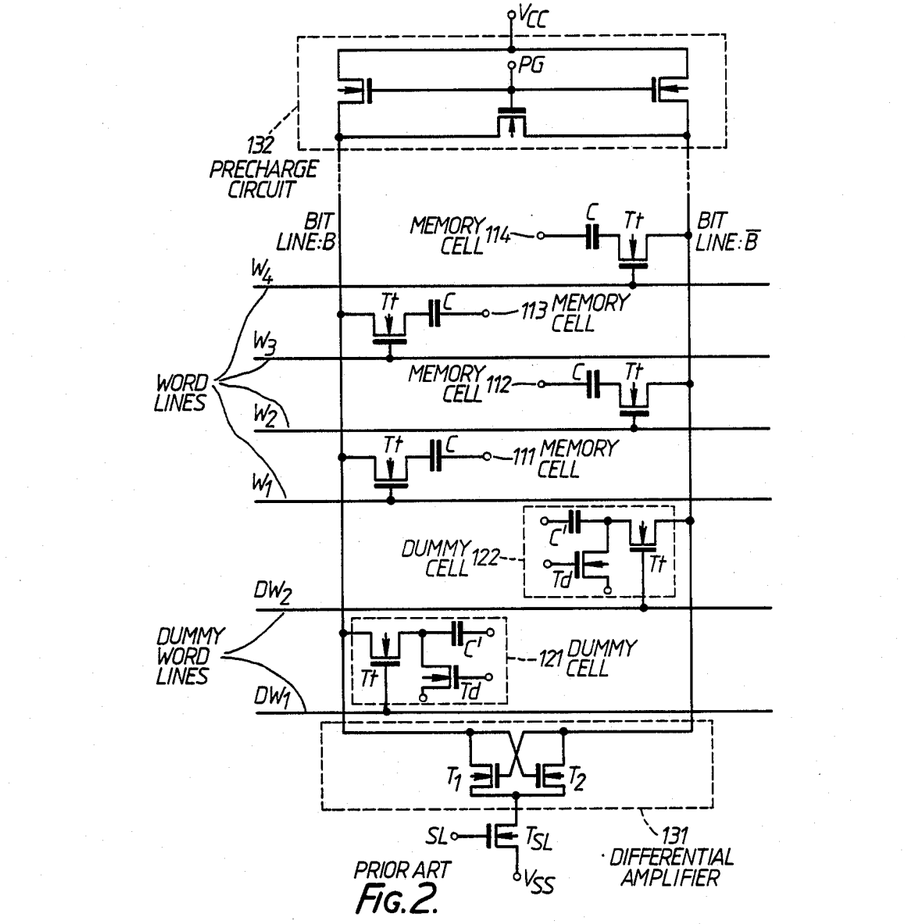
FIG. 2 is a circuit diagram of a conventional DRAM using the memory cell as shown in the FIG. 1.

FIG. 2 shows a DRAM using the memory cell as shown in FIG. 1. Source terminals of the memory cells (111, 113, . . . ) are connected to a bit line (B). On the other hand, source terminals of the memory cells (112, 114, . . . ) are connected to a bit line ($\overline{B}$). Gate terminals of the memory cells (111, 112, 113, 114, . . . ) are respectively connected to word lines ($W_1$, $W_2$, $W_3$, $W_4$, . . . ). The bit line (B) is connected to a dummy cell (121), and the other bit line ($\overline{B}$) is connected to another dummy cell (122). The gate terminal of the transistor ($T_t$) of the dummy cell (121) is connected to a dummy word line ($DW_1$). On the other hand, the gate terminal of the transistor ($T_t$) of the dummy cell (122) is connected to a dummy word line ($DW_2$). The two bit line (B, $\overline{B}$) are connected to a sense amplifier (131) and a precharge circuit (132).

There will now be described by reference to FIG. 2 and FIG. 3 operation of the DRAM shown in FIG. 2.

A. Reading operation under the condition that the memory cell (111) stores "1".

(i) At time $t_0$.

Voltage levels of all of the word lines ($W_1$, $W_2$, $W_3$, $W_4$, . . . ) and all of the dummy word lines ($DW_1$, $DW_2$) are $V_{SS}$ (e.g., 0 v). All of the transistors of the memory cells (111, 112, 113, 114, . . . ) and the dummy cells (121, 122) are nonconductive and none of cells (111, 112, 113, 114, . . . , 121, 122) are selected.

The voltage level of a sense latch signal (SL) is high and is supplied to a gate terminal of a transistor ($T_{SL}$). Sense amplifier (131) is thus operative.

The voltage level ($V_B$) of the bit line (B) is $V_{SS}$ because the sense amplifier (131) is flip-flop type differential amplifier.

The voltage level ($V_{\overline{B}}$) of the other bit line ($\overline{B}$) is nearly $V_{CC}$ because electric charge precharged prior to a reading cycle is stored in the stray capacitor existing between the bit line ($\overline{B}$) and the semiconductor substrate on which the DRAM is integrated.

(ii) At time $t_1$.

At time $t_1$, the voltage level of the precharge signal (PG) becomes high. Then, transistors ($T_{PG1}$, $T_{PG2}$, $T_{PG3}$) of the precharge circuit (132) become conductive. As a result, the bit lines (B, $\overline{B}$) are precharged to "1".

On the other hand, the voltage level of the sense latch signal (SL) is low and the transistor ($T_{SL}$) becomes nonconductive. As a result, the two bit lines (B, $\overline{B}$) are electrically separated from the $V_{SS}$ terminal.

Figure 3:
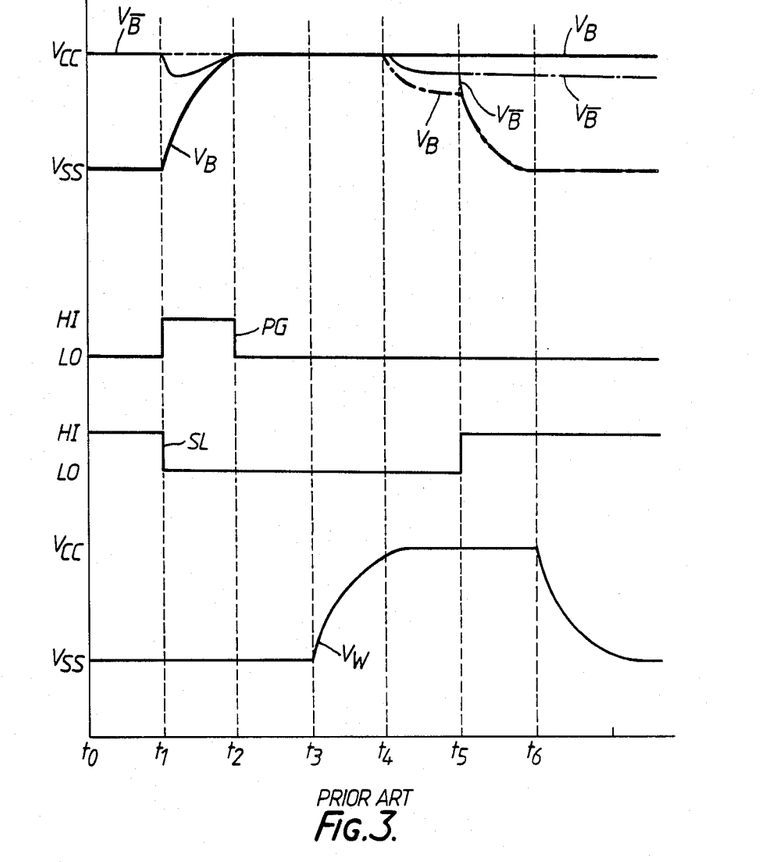
FIG. 3 is a timing diagram illustrating waveforms representing the operation of the respective parts of the DRAM of the FIG. 2.

As shown in FIG. 3, the voltage level ($V_B$) of the bit line ($\overline{B}$) drops a little. This change is due to phenomenon that current runs from the bit line ($\overline{B}$) to the bit line (B) when the transistor ($T_{PG2}$) becomes conductive. When another precharge circuit is used, the voltage level ($V_{\overline{B}}$) may be shown by the broken line in FIG. 3.

(iii) At time $t_2$.

Then the voltage level of the precharge signal (PG) becomes low.

(iv) At time t3.

The voltage level of the word line ($W_1$) connected to the memory cell (111) changes from "0" to "1". The voltage level of the dummy word line ($DW_2$) connected to the dummy cell (122) is also changes from "0" to "1". The signal "$V_W$" shown in the FIG. 3 illustrates the voltage level of the word line ($W_l$) and that of the dummy word line ($DW_2$).

(v) At time $t_4$.

The word liee ($W_l$) is sufficiently charged to "1". This means that the memory cell (111) is selected. The dummy word line (DW₂) is also sufficiently charged to "1", and the dummy cell (122) is selected too. (Prior to time t₄, the transistor (T_d) becomes conductive and a voltage level of the node between the transistor (T_t) and the capacitor (C') is brought to around V_SS.)

If leakage current does not flow through the transistor (T_t) of memory cell (111), the voltage level of the drain terminal, which is connetted to the capacitor (C), of the memory cell (111) is "V_CC-V th", where Vth is the threshold voltage of the transistor (T_t). On the other hand, the voltage level of the source terminal, which is connected to the bit line (B), of the memory cell (111) is kept at V_CC. Therefore, the transistor (T_t) remains nonconductive. That is to say, the voltage level (V_B) does not change even though the memory cell (111) is selected.

The voltage level of the drain terminal, which is connected to the capacitor (C), of the dummy cell (122) is nearly V_SS. On the other hand, the voltage level of the source terminal, which is connected to the bit line ($\overline{\text{B}}$), of the dummy cell (122) is nearly V_CC because the bit line ($\overline{\text{B}}$) remains V_CC.

This means that a potential difference between the drain and gate terminals of the transistor (T_t) of the dummy cell (122) is higher than a threshold voltage of the transistor (T_t) of the dummy cell (122). Therefore, this transistor (T_t) becomes conductive. As a result, precharged electric carrier on the bit line ($\overline{\text{B}}$) is distributed not only by the capacitor (C') of the dummy cell (122) but also by the stray capacitor of the bit line ($\overline{\text{B}}$).

This phenomenon is illustrated by using the following equations under the conditions that "Cp" is the stray capacitor of bit line ($\overline{\text{B}}$) and "V_x" is the voltage level of the bit line ($\overline{\text{B}}$) after the distribution.

$$C_p(v_{CC} - V_{SS}) = (C_p + C')V_x$$

Therefore, $$V_x = \frac{C_p}{C_p + C'} V_{CC} - V_{SS})$$
$$= \left(1 - \frac{C'}{C_p + C'}\right)(V_{CC} - V_{SS}).$$

The capacitance of the stray capacitor (Cp) is usually ten to hundreds times as large as that of the capacitor (C') because many memory cells are connected to the bit line ($\overline{\text{B}}$).

On the other hand, the capacitance (C') of the dummy cell (122) is usually one half that of the memory cell (111), i.e., C'=C/2. Accordingly, $$V_x = \left(1 - \frac{\frac{C}{2}}{C_p + \frac{C}{2}}\right)(V_{CC} - V_{SS})$$
$$\approx \left(1 - \frac{\frac{C}{2}}{C_p + C}\right)(V_{CC} - V_{SS})$$

Now, $$\frac{C}{C_p + C}(V_{CC} - V_{SS})$$

is represented by ΔV.
Then, $$V_x = V_{CC} - V_{SS} - \frac{\Delta V}{2}.$$

It is understood from the above equations that the voltage level of the bit line ($\overline{\text{B}}$) drops by ΔV/2 from V_CC. (See the solid line at time t₅ in FIG. 3)

(vi) At time t₅.

The voltage level of the sense latch signal (SL) becomes high. Then the transistor (T_SL) becomes conductive and the sense amplifier (131) starts its operation.

The sense amplifier (131) is a differential amplifier including a pair of cross-coupled MOS transistors (T_l, T₂) having a common source and having their gates connected to each other's drain. The transistor (T₂) becomes conductive and the transistor (T_l) does not because the voltage level at the gate terminal of the transistor (T₂) is higher than that of the transistor (T_l). The differential is ΔV/2.

Then, the voltage level of the bit line ($\overline{\text{B}}$) is brought to V_SS prior to time t₆ as shown in FIG. 3.

As a result, the potential difference between the two bit lines (B, $\overline{\text{B}}$) becomes V_CC−V_SS.

(vii) At time t₆.

The voltage levels of the word line (W_l) and the dummy word line (DW₂) becomes V_SS.

B. Reading Operation under the condition that the memory cell (111) stries "0".

Operation at time t₀ through t₃ under the condition that the memory cell (111) stores "0" is almost the same as that under the condition that the memory cell (111) stores "1", and the explanation thereof is therefore omitted.

(v) At time t₄.

The word line (W_l) is sufficiently charged to V_CC and the memory cell (111) is selected. The dummy word line (DW₂) is also sufficiently charged to V_CC. And the dummy cell (122) is selected.

The voltage level of the drain terminal, which is connected to the capacitor (C) of the memory cell (111) is nearly V_SS because the memory cell (111) stores a "0". On the other hand, the voltage level of the source terminal connected to the bit line (B) of the memory cell (111) is V_CC because the voltage level of the bit line (B) remains "1". Then, the potential difference between the drain and gate terminals of the transistor (T_t) of the memory cell (111) becomes higher than the threshold voltage of this transistor (T_t), and the transisoor (T_t) becomes conductive. Therefore, precharged electric carrier of the bit line (B) is distributed not only by the capacitor (C) of the memory cell (111) but also by the stray capacitor of the bit line (B).

This phenomenon is illustrated by using the following equations under the conditions that "Cp" is the stray capacitor of the bit line (B), where the values of stray capacitors of the bit line (B) and ($\overline{\text{B}}$) are generally the same, and "V_x" is the voltage level of the bit line (B) after the distribution.

$$C_p(V_{CC} - V_{SS}) = (C_p + C)V_x$$

-continued $$V_x = \left(1 - \frac{C}{C_p + C}\right)(V_{CC} - V_{SS})$$
$$= V_{CC} - V_{SS} - \Delta V.$$

It is apparent from the above equations that the voltage level of the bit line (B) drops by $\Delta V$ from $V_{CC}$. (See the dotted line at time $t_4$ in FIG. 3.)

Operation of the dummy cell (122) under the condition that the memory cell stores "0" is almost the same as that under the condition that the memory cell stores "1". That is to say, the voltage level of the bit line (B) is dropped by $\Delta V/2$ from $V_{CC}$. (See the dotted line at time $t_5$ in FIG. 3.)

(vi) At time $t_5$.

The voltage level of the sense latch signal (SL) becomes high, and the transistor ($T_{SL}$) becomes conductive. Then the sense amplifier (131) starts its operation. The transistor ($T_l$) becomes conductive and the transistor ($T_2$) does not because the voltage level of the gate terminal of the transistor ($T_l$) is higher than that of the transistor ($T_2$) by the differential amount of $\Delta V/2$.

Then, the voltage level of the bit line (B) is brought to $V_{SS}$ prior to time $t_6$ as shown in FIG. 3.

As a result, the potential difference between the two bit lines (B, $\overline{B}$) becomes $V_{CC}-V_{SS}\Delta V/2$.

(vii) At time $t_6$.

The voltage levels of the word line (Wl) and the dummy word line (DW$_2$) become "0".

Figure 4A:
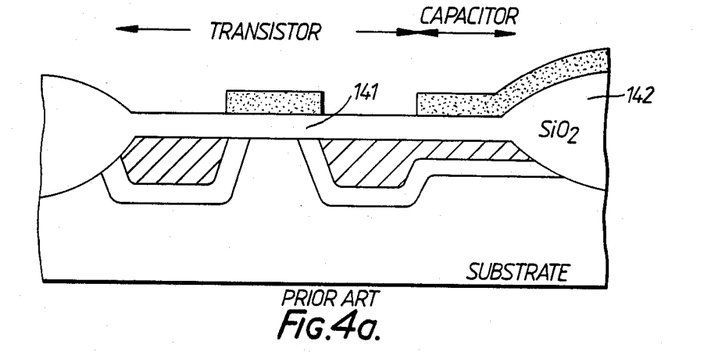
FIG. 4(a) is a cross-sectional view of the memory cell, as shown in the FIG. 1, cut along the gate length direction.
Figure 4B:
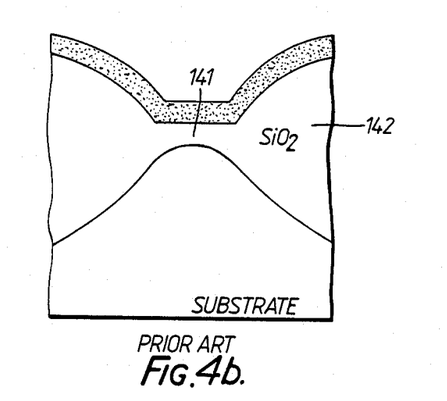
FIG. 4(b) is a cross-sectional view of the memory cell, as shown in the FIG. 1, cut along the gate width direction.

The capacity of a semiconductor memory like the abov DRAM has increased as micronization techniques have advanced. For example, a 1M-bit DRAM is made of small MOS (insulated gate type) transistors whose gates are 1 $\mu$m to 1.5 $\mu$m long. Moreover, a 4M-bit DRAM which will be developed in the future may be formed of MOS transistors whose gate lengths are reduced to about 0.8 $\mu$m, and a 16M-bit DRAM which will be developed in the future may be mdde of MOS transistors whose gate lengths are reduced to about 0.5 $\mu$m. Each memory cell of such a large-capacity DRAM includes two elements, i.e., a capacitor for storing data and a MOS transistor for transfering data as shown in FIG. 4(a). The shorter the gate length and effective channel length of the transfer MOS transistor, the more difficult it is to control the threshold voltage of the MOS transistor due to the short-channel effect and the more ambiguous a boundary line betwee a gate oxide (141) and a field oxide (142) (see FIG. 4(b)) becomes. Consequently, the subthreshold current of the MOS transistor flows too much to be negligible. That is, characteristics of data being stored deteriorate.

Figure 5:
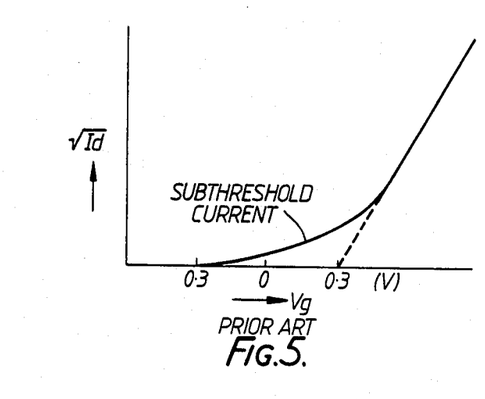
FIG. 5 is a graph illustrating the $V_g$ vs. $\sqrt{I_d}$ characteristic of the transistor as shown in the FIG. 1.

FIG. 5 shows the characteristics of $V_g$ vs. $\sqrt{I_D}$ of a MOS transistor. $V_g$ is the gate voltage ($V_g$) and $I_d$ is the drain current ($I_d$) under the conditions that the transistor gate length is 1.0 $\mu$m, the channel length is 0.8 $\mu$m, the gate oxide thickness is 150 Å, and the substrate density is $5 \times 10^{15}$ [cm$^{-3}$]. As shown in FIG. 5, a subthreshold current flows even though $V_g$ is 0 V. This means that any data stored in a nonselected memory cell disappear due to the subthreshold current. One approach to solve this problem is to refresh the data before the data thoroughly disappears. Indeed, where there is no problem with the subthreshold current, data stored in memory cells is usually refreshed because leakage current runs through the capacitor or through the pn junction. However, where the subthreshold current is a problem and ten to hundreds times as large as the leakage current, data stored in the memory cells are required to be refreshed to solve the problem due to the subthreshold current ten to hundreds times as frequently as to solve the problem due to the ordinary leakage current. Actually however, it is impossible to refresh so often.

Another approach to solve the problem due to the subthreshold current involves ion implantation, where ions of an acceptor impurity are implanted into the channel region of the N-channel transfer transistor and also into the region below this channel region in a high concentration to suppress the subthreshold current or the short-channel effect. If this measure is taken, the effective threshold voltage changes due to the reverse bias effect of the N-channel transistor, the channel mobility of the transistor is deteriorated, or the source-drain junction capacitance of the transistor for transfering data increases (see FIG. 4(a)). Consequently, the capacitance of the stray capacitor will increase.

SUMMARY OF THE INVENTION

Accordingly, one object of this invention is to provide a new and improved DRAM (dynamic read-write random access memory) which minimizes the dissipation of electric carrier stored in a nonselected memory cell.

Another object of this invention is to provide a new and improved DRAM which minimizes the dissipation of electric carrier stored in a nonselected memory cell without increasing the junction capacitance of the transfer transistor and the capacitance of the stray capacitor.

According to this invention, the forgoing and other objects are attained by providing a novel dynamic read-write random access memory (DRAM) including (a) a memory cell having a capacitor connected in series with a switching means; (b) a word line for selecting or nonselecting the memory cell; (c) a bit line connected to the memory cell for transfering data from or to the memory cell in response to a logic operation of the DRAM; and (d) a circuit for applying to the bit line a voltage level between the voltage level of the word line and that of a connecting point between the capacitor and the switching means when the memory cell is not selected.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 6:
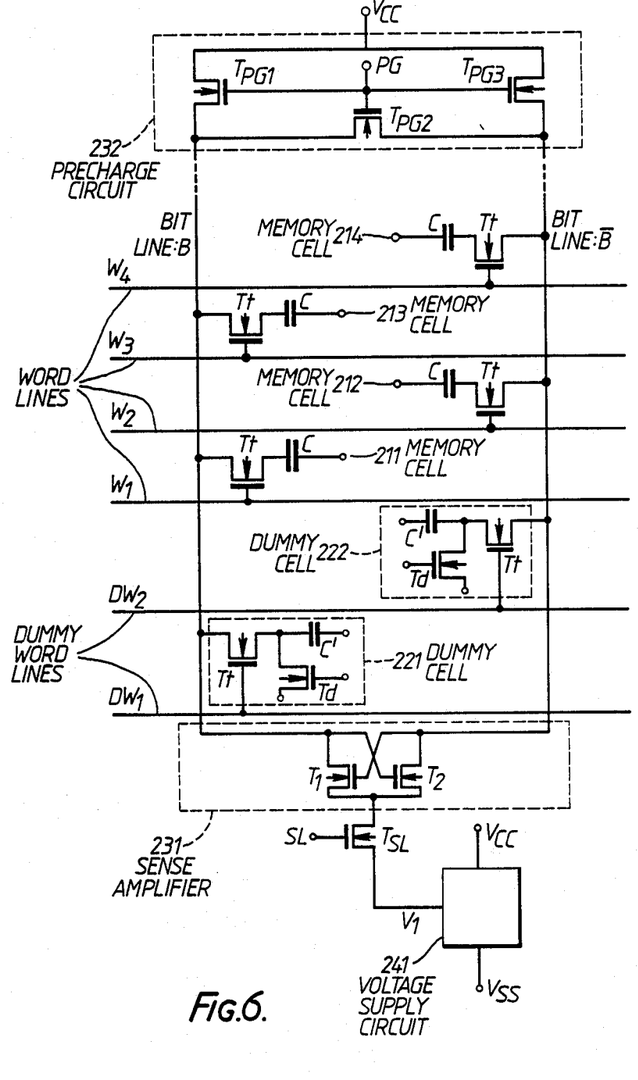
FIG. 6 is a circuit diagram of a DRAM according to a typical embodiment of this invention.

Referring now to the drawings, wherein like reference numerals designate identical or corresponding parts throughout the several views, and more particularly to FIG. 6 thereof, each of memory cells (211, 212, 213, 214, ...) includes a MOS transistor ($T_t$) and a capacitor (C) connected in series to the transistor ($T_t$). Gate terminals of memory cells (211, 212, 213, 214, ...) are connected to respective word lines ($W_1$, $W_2$, $W_3$, $W_4$, ...).

These word lines ($W_1$, $W_2$, $W_3$, $W_4$, ...) are connected to an address decoder (not shown).

Source terminals of memory cells (211, 212, 213, 214, ...) are respectively connected to one or the other of two bit lines (B, $\overline{B}$). It is preferable that the memory cells (211, 212, 213, 214, ...) are alternately connected to the bit line (B) and the bit line ($\overline{B}$), for the purpose of balancing stray capacitance associated with the two bit lines.

The bit line (B) is connected to a dummy cell (221), and the bit line ($\overline{B}$) is connected to another dummy cell (222). Each of the two dummy cells includes a voltage supply terminal supplied with one voltage potential $V_{CC}$, e.g., 5 V, a capacitor (C') for storing data and having a first charge eerminal connected to the voltage supply terminal and a second charge terminal, a MOS transistor ($T_t$) for transfering data and having a drain terminal connected to the second charge terminal, a source terminal connected to a respective bit line (B, $\overline{B}$) and a gate terminal, and a MOS transistor ($T_d$) having a drain terminal connected to a node between the capacitor (C') and the transistor ($T_t$) and a source terminal connected to a voltage supply terminal supplied with another voltage potential $V_{SS}$, e.g., 0 V.

The gate terminal of the dummy cell (221) is connected to a dummy word line ($DW_1$), and the gate terminal of the dummy cell (222) is connected to a dummy word line ($DW_2$). The dummy cell (221) connected to the bit line (B) is selected when one of the memory cells (212, 214, ...) connected to the bit line ($\overline{B}$) is selected. Similarly, the dummy cell (222) connected to the bit line ($\overline{B}$) is selected when one of memory cells (211, 213, ...) connected to the bit line (B) is selected.

The two bit lines (B, $\overline{B}$) are connected to a sense amplifier (231) and a precharge circuit (232).

The sense amplifier (231) includes a pair of cross-coupled n channel type transistors (T1, T2) having a common source connection and having their gates connected to each other's drain. The drain terminal of the transistor ($T_j$) is connected to the bit line (B), and the drann terminal of the transistor (T2) is connected to the bit line ($\overline{B}$). The common source connection is connected to an output terminal of a voltage supply circuit (241) through a switching transistor ($T_{SL}$).

The voltage supply circuit (241) is supplied with a voltaee potential having a $V_{CC}$ voltage level and with a voltage potential having a $V_{SS}$ voltage level. The circuit (241) supplies a voltage potential having a mid-voltage level ($V_1$) between $V_{SS}$ and $V_{CC}$. ($V_{SS} < V_1 < V_{CC}$).

The mid-voltage level ($V_1$) is between the voltage levels of the gate and drain terminals of nonselected memory cell.

Figure 7:
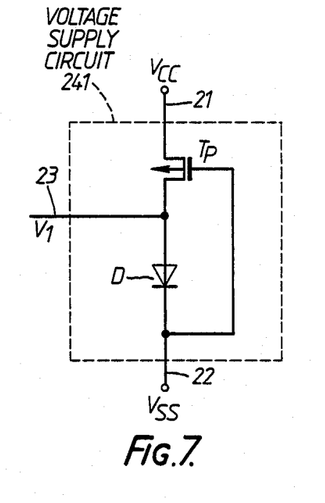
FIGS. 7, 8 and 9 are circuit diagrams of voltage supply circuits which can be used in the DRAM as shown in the FIG. 6.
Figure 8:
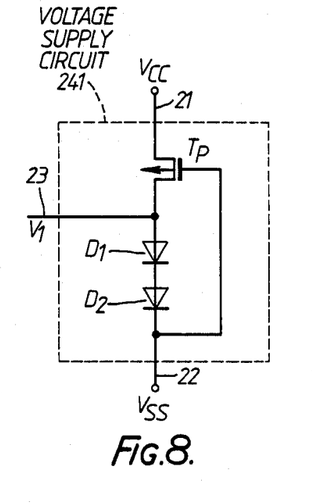
Figure 9:
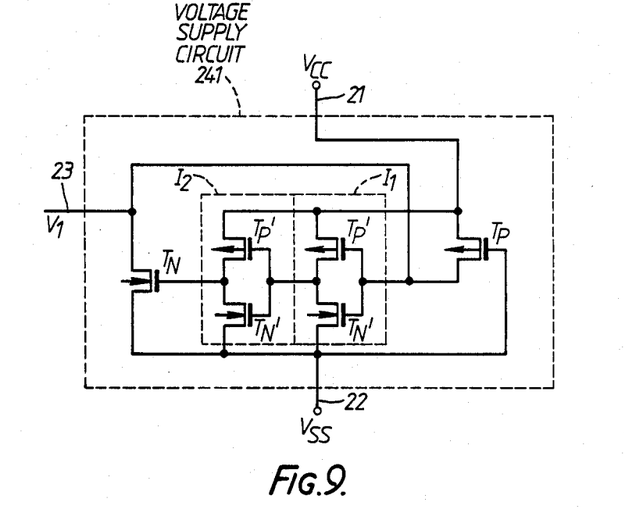

FIGS. 7, 8 and 9 show circuits which may be used as the voltage supply circuit o the DRAM shown in FIG. 6. In the voltage supply circuit (241) of FIG. 7, a P-channel MOS transistor ($T_p$) is connected in series to a diode element (D). The series circuit of transistor ($T_p$) and diode element (D) is coupled between a $V_{CC}$ power source line (21) and a $V_{SS}$ power source line (22) with the gate of the transistor ($T_p$) connected to the $V_{SS}$ power source line (22). At the connecting point between the drain of the transistor ($T_p$) and the nnode of the diode element (D), there is obtained the voltage $V_l$ which is different from the $V_{SS}$ power source potential by the forward voltage drop dV of the diode element (D). This voltage $V_1$ is output via an output voltage line (23).

The voltage supply circuit (241) shown in FIG. 8 is different from the circuit of FIG. 7 only in that two serially connected diode elements ($D_1$, $D_2$) are used in place of the diode element (D). In this circuit (241), the value of dV is twice the forward voltage of one diode element.

In the voltage supply circuit (241) of FIG. 9, a series circuit composed of a P-channel transistor ($T_p$) and an N-channel transistor ($T_N$) is connected between the $V_{CC}$ power source line (21) and the $V_{SS}$ power source line (22). A 2-stage inverter unit made of two CMOS inverters ($I_1$, $I_2$) is connected between the node of these transistoss ($T_p$, $T_N$) and the gate of the N-channel transistor ($T_N$). The gate of the P-channel transistor ($T_p$) is connected to the $V_{SS}$ power source line (22). The output voltage $V_1$ obtained at the node of the transistors ($T_p$, $T_N$) is sppplied through an output voltage line (23). When the voltage at this node is lower than the threshold voltage of the first-stage CMOS inverter ($I_1$), the output of this CMOS inverter ($I_1$) is equal to the $V_{CC}$ potential and that of the second stage CMOS inverter ($I_2$) is equal to the $V_{SS}$ potential. As a result, the N-channel transistor ($T_N$) is turned off. On the other hand, when the voltage at said node is higher than the threshold voltage of the CMOS inverter ($I_1$), the output of this CMOS inverter ($I_1$) is equal to the $V_{SS}$ potential and the second-stage CMOS inverter ($I_2$) is equal to the $V_{CC}$ potential. In this case, the N-channel ($T_N$) is turned on, whereby the output voltage $V_1$ becomes equal to the threshold voltage of the CMOS inverter ($I_1$). The inverters ($I_1$, $I_2$) are each formed of a P-channel transistor ($T_P$) and an N-channel transistor ($T_{N'}$).

In the examples of the voltage supply circuit (241) shown in FIGS. 7 and 8, the mid-voltage level ($V_1$) is decided by the forward voltage drop (usually 0.6~0.9) of one or more diodes. On the other hand, in the voltage supply circuit (241) shown in FIG. 9 the mid-voltage level ($V_1$) is decided by the threshold voltage of the inverter ($I_1$). A desired value of a mid-voltage level ($V_1$) is easily obtained when the voltage supply circuit (241) as shown in FIG. 9 is used because the level ($V_1$) is decided by the threshold voltage.

The precharge circuit (232) is composed of a MOS transistor ($T_{PG1}$) connected between the $V_{CC}$ voltage terminal and the bit line (B), a MOS transistor ($T_{PG2}$)

connected between the bit line (B) and the bit line ($\overline{B}$) and a MOS transistor ($T_{PG3}$) connected between the $V_{CC}$ voltage terminal and the bit line ($\overline{B}$). Gate terminals of the transistors ($T_{PG1}$, $T_{PG2}$, $T_{PG3}$) are commonly connected to a common gate terminal which is supplied with a precharge signal (PG).

There will now be described by reference to FIG. 6 and FIG. 10 the operation of the DRAM as shown in FIG. 6.

A. Reading Operation under the condition that the memory cell (211) stores a "1".

(i) At time $t_0$.

Voltage levels of all of the word lines ($W_1$, $W_2$, $W_3$, $W_4$, ...) and all of the dummy word lines ($DW_1$, $DW_2$) are $V_{SS}$, e.g., 0 V. All of the transistors of the memory cells (211, 212, 213, 214, ...) and the dummy cells (221, 222) are nonconductive and none of the cells (2111, 212, 213, 214, ..., 221, 222) is selected.

The voltage level of the precharge signal (PG) is low and the precharge circuit (232) does not yet operate.

The voltage level of the sense latch signal (SL) is high and the sense amplifier (231) is operating. The sense latch signal (SL) is supplied to the gate terminal of the transistor ($T_{SL}$).

The voltage level ($V_B$) of the bit line (B) is $V_1$ because the sense amplifier (231) is a flip-flop type differential amplifier.

The voltage level ($V_{\overline{B}}$) of the other bit line ($\overline{B}$) is nearly $V_{CC}$ because electric charge precharged prior to a reading cycle is stored in the stray capacitor existing between the bit line ($\overline{B}$) and the semiconductor substrate on which the DRAM is integrated.

(II) At time $t_1$.

At time $t_1$, the voltage level of the precharge signal (PG) becomes high. Then, transistors ($T_{PG1}$, $T_{PG2}$, $T_{PG3}$) of the precharge circuit (232) become conductive. As a result, the bit lines (B, $\overline{B}$) are precharged to "1".

On the other hand, the voltage level of the sense latch signal (SL) is low and the transistor ($T_{SL}$) becomes non-conductive. As a result, the two bit lines (B, $\overline{B}$) are electrically separated from the output terminal of the voltage supply circuit (241).

Figure 10:
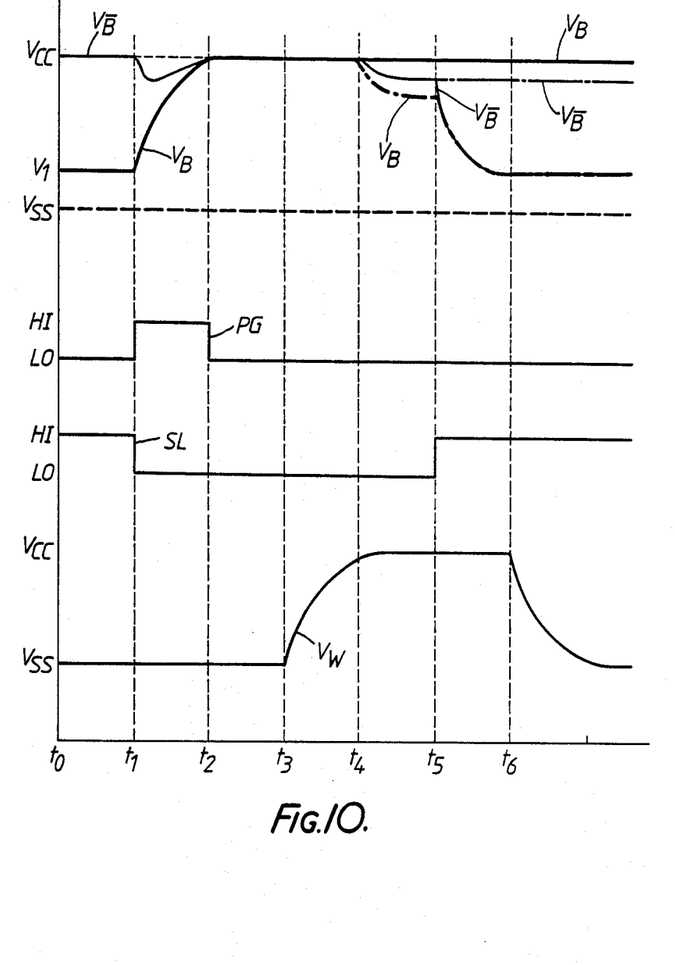
FIG. 10 is a timing diagram illustrating waveforms representing the operation of the respective parts of the DRAM of FIG. 6.

As shown in FIG. 10, the voltage level ($V_{\overline{B}}$) of the bit line ($\overline{B}$) drops a little. This change is due to phenomenon that current runs from the bit line ($\overline{B}$) to the bit line (B) when the transistor ($T_{PG2}$) becomes conductive. When another precharge circuit is used, the voltage level ($V_{\overline{B}}$) may be shown by the broken line in FIG. 10.

(iii) At time $t_2$.

Then the voltage level of the precharge signal becomes low.

(iv) At time $t_3$.

The voltage level of the word line ($W_1$) connected to the memory cell (211) changes from "0" to "1". The voltage level of the dummy word line ($DW_2$) connected to the dummy cell (222) also changes from "0" to "1". The voltage level "$V_W$" shown in FIG. 10 illustrates the voltage level of the word line ($W_1$) and that of the dummy word line ($DW_2$).

(v) At time $t_4$.

The word line ($W_1$) is sufficiently charged to "1". This means that the memory cell (211) is selected. The dummy word line ($DW_2$) is also sufficiently charged to "1", and the dummy cell (222) is selected too. (Prior to time $t_4$, the voltage level of the node between the transistor ($T_t$) and the capacitor (C') is brought to around $V_{SS}$.)

If leakage current does not flow through the transistor ($T_t$), the voltage level of the drain terminal, which is connected to the capacitor (C) of the memory cell (211) is "$V_{CC}$-Vth", where Vth is the threshold voltage of the transistor ($T_t$). On the other hand, the voltage level of the source terminal which is connected to the bit line (B) of the memory cell (211) is kept at $V_{CC}$. Therefore, the transistor ($T_t$) of cell (211) remains nonconductive. That is to say, the voltage level ($V_B$) does not change even through the memory cell (211) is selected.

The voltage level of the drain terminal, which is connected to the capacitor (C), of the dummy cell (222) is nearly $V_{SS}$. On tee other hand, the voltage level of the source terminal, which is connected to the bit line ($\overline{B}$), of the dummy cell (222) is nearly $V_{CC}$ because the bit line (B) remains $V_{CC}$.

This means that the potential difference between the drain terminal of the transistor ($T_t$) and the gate terminal of the transistor ($T_t$) is higher than the threshold voltage of the transistor ($T_t$) of the dummy cell (222). Therefore transistor ($T_t$) of cell (222) becomes conductive. As a result, precharged electric carrier on the bit line ($\overline{B}$) is distributed not only by a capacitor (C') of the dummy cell (222) but also by the stray capacitance of the bit line ($\overline{B}$).

This phenomenon is shown by using the following equations under the conditions that "$C_p$" is the stray capacitance of bit line ($\overline{B}$) and "$V_x$" is the voltage level of the bit line ($\overline{B}$) after the distribution.

$$C_P(V_{CC}-V_1)=(C_P+C')V_x$$

Therefore, $$V_x = \frac{C_p}{C_p + C'}(V_{CC} - V_1)$$
$$= \left(1 - \frac{C'}{C_p + C'}\right)(V_{CC} - V_1).$$

The capacitance of the stray capacitor ($C_p$) is usually ten to hundreds of times as large as that of the capacitor (C') because many memory cells are connected to the bit line ($\overline{B}$).

On the other hand, the capacitance (C') of the dummy cell (222) is usually one half that of the memory cell (211) i.e., C'=C/2. Accordingly, $$V_x = \left(1 - \frac{\frac{C}{2}}{C_p + \frac{C}{2}}\right)(V_{CC} - V_1)$$

$$v_x \simeq \left(1 - \frac{\frac{C}{2}}{C_p + C'}\right)(V_{CC} - V_1).$$

When $$\frac{C}{C_p + C'}(V_{CC} - V_1)$$

is represented by $\Delta V$, then, $$V_x \simeq V_{CC} - V_1 - \frac{\Delta V}{2}.$$

It is understood from the above equations that the voltage level of the bit line (B) drops by $\Delta V/2$ (See the solid line at time $t_5$ in FIG. 10.)

(vi) At time $t_5$.

The voltage level of the sense latch signal (SL) becomes high. Then the transistor ($T_{SL}$) become conductive and the sense amplifier (231) starts its operation.

The sense amplifier (231) is a differential amplifier formed by a pair of cross-coupled MOS transistor ($T_1$, $T_2$) having a common source and having their gates connected to each other's drain. The transistor ($T_2$) becomes conductive and the transistor ($T_1$) does not because the voltage level of the gate terminal of the transistor ($T_2$) is higher than that of the transistor ($T_1$). (The differential is $\Delta V/2$).

Then the voltage level of the bit line ($\bar{B}$) is brought to $V_1$ prior to time $t_6$ as shown in FIG. 3.

As a result, the potential difference between the two bit lines (B, $\bar{B}$) becomes ($V_{CC} - V_1$).

(vii) At time $t_6$.

The voltage levels of the word line ($W_1$) and the dummy word line ($DW_2$) becomes $V_{SS}$.

B. Reading Operation under the condition that the memory cell (211) stores a "0".

Operation at time $t_0$ through $t_3$ under the condition that the memory cell (211) stores "0" is almost the same as that under the condition that the memory cell (211) stores "1", and the explanation thereof is therefore omitted.

(v) At time $t_4$.

The word line ($W_1$) is sufficiently charged to $V_{CC}$ and the memory cell (211) is selected. The dummy word line ($DW_2$) is sufficiently charged to $V_{CC}'$ too, and the dummy cell (222) is selected.

The voltage level of the drain terminal, which is connected to the capacitor (C) ff the memory cell (211) is nearly $V_1$ because the memory cell (211) stores a "0". On the other hand, the voltage level of the source terminal connected to the bit line (B) of the memory cell (211) is $V_{CC}$ because the voltage level of the bit line ($\bar{B}$) remains a "1". Then, the potential difference betwee the drain and gate terminals of the transistor ($T_t$) of the memory cell (211) becomes higher than the threshold voltage of the transistor ($T_t$) of the memory cell (211), and this transistor ($T_t$) becomes conductive. Therefore, precharged elettric charge of the bit line (B) is distributed not only by the capacitor (C) of the memory cell (211) but also by the stray capacitance of the bit line (B).

This phenomenon is shown by using the following equations under the conditions that "$C_P$" is the stray capacitance of the bit line ($\bar{B}$), it being understood that the values of stray capacitance of the bit line (B) and ($\bar{B}$) are generally same, and that "$V_x$" is the voltage level of the bit line (B) after the distribution.

$$C_p(V_{CC} - V_1) = (C_p + C)V_x$$

$$V_x = \left(1 - \frac{C}{C_p + C}\right)(V_{CC} - V_1)$$

$$= V_{CC} - V_1 - \Delta V$$

It is apparent from the above equations that the voltage level of the bit line (B) drops by $\Delta V$ from $V_{CC}$, as is shown by the dotted line at time $t_5$ in FIG. 10.

Operation of the dummy cell (222) under the condition that the memory cell stores a "0" is almost the same as that under the condition that the memory cell stores a "1". That is to say, the voltage level of the bit line ($\bar{B}$) is dropped by $\Delta V/2$ from $V_{CC}$, as is shown by the dotted line at time $t_5$ in FIG. 10.

(vi) At time $t_5$.

The voltage level of the sense latch signal (SL) becomes high, and the transistor ($T_{SL}$) becomes conductive. Then the sense amplifier (231) starts its operation. The transistor ($T_1$) becomes conductive and the transistor ($T_2$) does not because the voltage level of the gate terminal of the transistor ($T_1$) is higher than that of the transistor ($T_2$) by a differential amount equal to $\Delta V/2$.

Then, the voltage level of the bit line (B) is brought to $V_1$ prior to time $t_6$ as shown in FIG. 10.

As a result, the potential difference between the two bit lines (B, $\bar{B}$) becomes $V_{CC} - V_1 - \Delta V/2$.

(vii) At time $t_6$.

The voltage levels of the word line ($W_1$) and the dummy word line ($DW_2$) become a "0".

A key feature of this embodiment ofthe present invention is that the lower voltage level applied to the bit line (i.e. $V_1$) is a level between $V_{CC}$ and $V_{SS}$, whereas the lower voltage level applied to the bit line in the conventional DRAM is $V_{SS}$. In this embodiment, $V_1$ is 0.6 V. Therefore, the actual gate voltage ($V_G$) of the memory cell (211), i.e., the voltage level of the gate terminal relative to that of the source terminal, is "$V_{SS} - V_1$ equals $-0.6$, i.e, $V_G = -0.6$ V.

As shown in FIG. 5, no subthreshold current flow at $V_G = -0.6$ V.

Therefore data-dissipation from the memory cell due to the subthreshold current does not take place according to this embodiment of the invention.

Further, more frequent refreshing to prevent data from dissipating due to the subthreshold current is not required. That is to say, an ordinary refresh-cycle can be used in the embodiment. Further, an ion implantation as explained using FIG. 4(a) and FIG. 4(b), under the channel region of the transistor for transfering data is not required. Thus, the impurity concentration in the area under the channel region can be kept low when ions are not implanted there. Therefore the stray caaacitance can be made small in this embodiment.

In this embodiment, the sense amplifier (231) and the dummy cells (221, 222) are used. However, the invention can be used in a memory which does not use the sense amplifier (231) and the dummy cells (221, 222).

Also, one reference voltage potential source of the sense amplifier (231), being connected to the bit line ($\bar{B}$), might be used instead of the dummy cell (222). The voltage level of such a reference voltage potential is, for example, about "$V_{CC} - \Delta V/2$".

Figure 11:
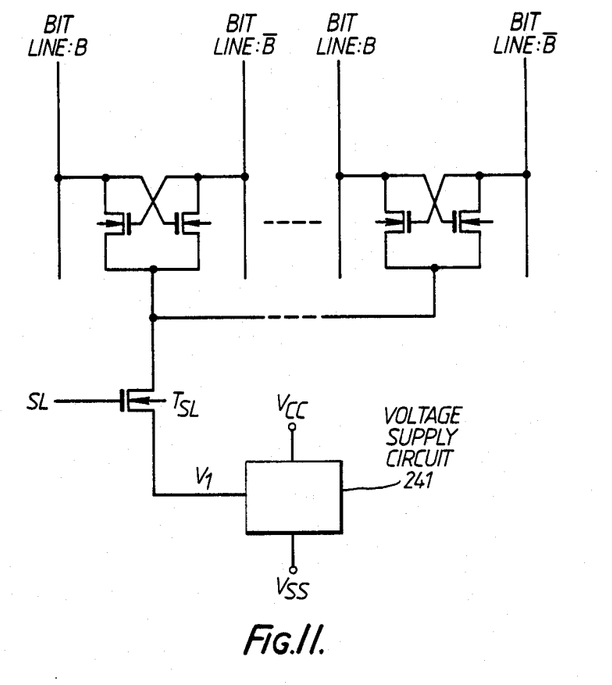
FIG. 11 is a circuit diagram of a part of a DRAM according to another embodiment of the invention.

FIG. 11 shows a circuit diagram of a part of a DRAM according to another embodiment of the invention. In this embodiment, the DRAM has a plurality of pairs of bit lines (B, $\bar{B}$), and a plurality of sense amplifiers as shown in FIG. 6. Each of the amplifiers is connected to a corresponding pair of bit lines (B, $\bar{B}$). The sense amplifiers each have commonly connected source terminals, which are connected to an output terminal of the voltage supply circuit (241) through a switching transistor ($T_{SL}$).

The other parts of this embodiment are the same as those of the first embodiment.

In this embodiment, only one voltage supply circuit (241) is required. That is to say, smaller numbers of transistors are required in this embodiment.

In the each of the embodiments, the transistors ($T_t$) for transfering data and transistors ($T_1$, $T_2$) of the sense amplifier are N-channel type MOS transistors. These transistors may be replaced by P-channel type MOS transistors. In this case, the same advantages as achieved by the above embodiments are obtained only by reversin the reference potentials of the elements.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A dynamic read-write random access memory, comprising;
   a memory cell including,
   a supply voltage terminal,
   a capacitive means having a first charge terminal connected to said supply voltage terminal and a second charge terminal, and
   switching means, having a first conduction terminal connected to said second charge terminal and a second conduction terminal, for forming a conduction path between said first and second conduction terminals, said switching means having a control terminal for controlling the impedance of said conduction path;
   a word line connected to said control terminal,
   said word line having a first voltage level when said memory cell is selected and second voltage level when said memory cell is not selected;
   a bit line connected to said second conduction terminal; and,
   voltage applying means for applying to said bit line a voltage level comprising,
   a MOS transistor having source, drain and gate terminals; and
   a first diode connected in series with said source and drain terminals between a pair of voltage sources, said gate terminal connected to that voltage source connected to said diode, wherein the voltage level applied by said voltage level applying means is derived from a junction between the source-drain path of said transistor and said diode, between said second voltage level of said word line and a voltage level of said first conduction terminal when said memory cell is not selected, thereby preventing leakage current from flowing through said conduction path when said memory cell is not selected.

2. A dymanic read-write random access memory according to claim 1, further comprising:
   means for detecting a change of voltage level of said bit line when said memory cell is selected.

3. A dynamic read-write random access memory according to claim 2, wherein said switching means comprises:
   a transistor.

4. A dynamic read-write random access memory according to claim 3, wherein said transistor comprises:
   a MOS transistor.

5. A dynamic read-write random access memory according to claim 2, wherein said detecting means comprises:
   a differential amplifier having a first input terminal connected to said bit line and a second input terminal connected to a reference voltage.

6. A dynamic read-write random access memory according to claim 5, wherein said differential amplifier comprises:
   a pair of cross-coupled MOS transistors having a common source connection and having the gate of each MOS transistor connector to the drain of the other MOS transistor.

7. A dynamic read-write random access memory according to claim 6, further comprising:
   a switching transistor having a first conduction terminal connected to said common source connection and a second conduction terminal connected to an output terminal of said voltage applying means, said switching transistor rendered conductive when said memory cell is selected.

8. A dynamic read-write random access memory according to claim 5, wherein said second input terminal of said differential amplifier is supplied with a reference power source having a predetermined reference voltage level.

9. A dynamic read-write random access memory according to claim 5, further comprising:
   a dummy cell connected to said second input terminal of said differential amplifier.

10. A dynamic read-write random access memory according to claim 2, further comprising:
    precharge means for precharging said bit line.

11. A dynamic read-write random access memory according to claim 1, wherein said voltage level applying means comprises:
    a second diode connected in series with said first diode.

12. A dynamic read-write random access memory according to claim 1, wherein said voltage applying means comprises:
    first and second MOS transistors having source drain paths connected in series between first and second voltage sources;
    a first inverter having an input connected to a junction between the source-drain paths of said first and second MOS transistors, and an output;
    a second inverter circuit having an input connected to the output of said first inverter circuit and an output connected to the gate of said second MOS transistor, wherein the gate of said first MOS transistor is connected to a selected of said first and second voltage sources and said voltage level applied by said voltage level applying means is derived from said function.

13. A dynamic read-write random access memory, comprising:
    a first memory cell including,
    a supply voltage terminal,
    a first capacitive means having a first charge terminal connected to said supply voltage terminal and a second charge terminal, and
    a first switching means, having a first conduction terminal connected to said second charge terminal of said first capacitive means and a second conduction terminal, for forming a conduction path between said first and second conduction terminals, said first switching means having a control terminal for controlling the impedance of said conduction path;

a first word line connected to said control terminal of said first switching means, said first word line having a first voltage level when said first memory cell is selected and a second voltage level when said first memory cell is not selected;

a first bit line connected to said second conduction terminal of said first switching means;

a second memory cell including, a supply voltage terminal, a second capacitive means having a first charge terminal connected to said second charge terminal of said second capacitance means and a second conduction terminal, for forming a conduction path between said first and second terminals of said second switching means, said second switching means having a control terminal for controlling the impedance of the conduction path thereof;

a second word line connected to said control terminal of said second switching means, said second word line having a first voltage level when said second memory cell is selected and a second voltage level when said second memory cell is not selected;

a second bit line connected to said second conduction terminal of said second memory cell;

a differential amplifier including a pair of cross-coupled MOS transistors having drains respectively connected to said first bit line and said second bit line, a common source connection, and respective gates connected to the drain of the other MOS transistor of said pair; and voltage level applying means for applying to said first bit line a voltage level between the voltage level of said word line and the voltage level of said first conduction terminal of said first memory cell when said first memory cell is not selected, thereby preventing a leakage current from flowing through said conduction path of said first memory cell when said first memory cell is not selected.

14. A dynamic read-write random access memory according to claim 13, further comprising:

a switching transistor having a first conduction terminal connected to said common source connection and a second conduction terminal connected to an output terminal of said voltage level applying means, said switching transistor rendered conductive when said first memory cell is selected;

a first dummy cell connected to said first bit line;

a second dummy cell connected to said second bit line; and precharge means for precharging said first and second bit lines.

15. A dynamic read-write random access memory according to claim 13, wherein said voltage level applying means comprises:

a MOS transistor having source, drain and gate terminals; and a first diode connected in series with said source and drain terminals between a pair of voltage sources, said gate terminal connected to that voltage source connected to said diode, wherein the voltage level applied by said voltage level applying means is derived from a junction between the source-drain path of said transistor and said diode.

16. A dynamic read-write random access memory according to claim 15, wherein said voltage level applying means comprises:

a second diode connected in series with said first diode.

17. A dynamic read-write random access memory according to claim 13, wherein said voltage level applying means comprises:

first and second MOS transistors having source-drain paths connected in series between first and second voltage sources;

a first inverter having an input connected to a junction between the source-drain paths of said first and second MOS transistors, and an output;

a second inverter circuit having an input connected to the output of said first inverter circuit and an output connected to the gate of said second MOS transistor, wherein the gate of said first MOS transistor is connected to a selected one of said first and second voltage sources and said voltage level applied by said voltage level applying means is derived from said junction.

18. A dynamic read-write random access memory according to claim 13, further comprising:

a switching transistor having a first conduction terminal connected to said common source connection and a second conduction terminal connected to an output terminal of said voltage level applying means, said switching transistor rendered conductive when said first memory cell is selected.

19. A dynamic read-write random access memory, comprising:

a memory cell including, a supply voltage terminal, capacitive means having a first charge terminal connected to said supply voltage terminal and a second charge terminal, and switching means, having a first conduction terminal connected to said second charge terminal and a second conduction terminal, for forming a conduction path between said first and second conduction terminals, said switching means having a control terminal for controlling the impedance of said conduction path;

a word line connected to said control terminal, said word line having a first voltage level when said memory cell is selected and a second voltage level when said memory cell is not selected;

a bit line connected to said second conduction terminal; and means for bringing a voltage between said second voltage level of said word line and a voltage level of said bit line when said memory cell is not selected, thereby preventing leakage current from flowing through said conduction path when said memory cell is not selected.

* * * * *